(12) United States Patent
Zhou et al.

(10) Patent No.: US 7,554,203 B2
(45) Date of Patent: Jun. 30, 2009

(54) ELECTRONIC ASSEMBLY WITH STACKED IC'S USING TWO OR MORE DIFFERENT CONNECTION TECHNOLOGIES AND METHODS OF MANUFACTURE

(75) Inventors: Qing A Zhou, Chandler, AZ (US); Daoqiang Lu, Chandler, AZ (US); Wei Shi, Gilbert, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 11/427,917

(22) Filed: Jun. 30, 2006

(65) Prior Publication Data

US 2008/0003717 A1 Jan. 3, 2008

(51) Int. Cl.
*H01L 29/40* (2006.01)
(52) U.S. Cl. .................................. 257/777; 257/778
(58) Field of Classification Search ................ 257/777, 257/778, 686
See application file for complete search history.

(56) References Cited

U.S. PATENT DOCUMENTS 6,407,456 B1 * 6/2002 Ball ........................... 257/777

* cited by examiner

*Primary Examiner*—Roy K Potter
(74) *Attorney, Agent, or Firm*—Schwegman, Lundberg & Woessner, P.A.

(57) ABSTRACT

An integrated circuit ("IC") package having two or more dice stacked on a substrate and electrically coupled using two or more different connection technologies may improve high-speed input/output ("I/O") bandwidth. In an embodiment, one die is a processor and at least one other die is a dynamic random access memory ("DRAM"). One or more of the dice may be thinned and placed between the substrate and a portion of one or more of the other dice, which may be horizontally offset. One or more of the dice may be embedded in the substrate. The dice may be coupled to each other and to the substrate using a combination of controlled-collapse chip connection ("C4") and wirebonding connection technologies. Methods of fabrication, and application of the package to an electronic assembly and to an electronic system, are also described.

15 Claims, 4 Drawing Sheets

ELECTRONIC ASSEMBLY WITH STACKED IC'S USING TWO OR MORE DIFFERENT CONNECTION TECHNOLOGIES AND METHODS OF MANUFACTURE

TECHNICAL FIELD

The subject matter relates generally to electronics packaging and, more particularly, to an electronics package with stacked integrated circuit ("IC") dice using two or more different connection technologies between the dice and a substrate to which the dice may be coupled, and to manufacturing methods related thereto.

BACKGROUND INFORMATION

An integrated circuit ("IC") die may be assembled into an IC package by physically and electrically coupling it to a substrate made of organic or ceramic material. One or more IC packages may be physically and electrically coupled to a printed circuit board ("PCB") to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, etc.), computer-related peripherals (e.g., printer, scanner, monitor, etc.), entertainment devices (e.g., television, radio, stereo, tape and compact disc players, video cassette recorder, camcorder, digital camera, MP3 (Motion Picture Experts Group, Audio Layer 3) player, etc.), and the like.

An IC package may comprise one or more IC dice. At least one surface of a die may comprise a number of pads or contacts to couple the die functionally to another element, such as an IC substrate. An IC substrate may comprise a number of layers. Some layers may comprise organic or ceramic dielectric material. Some layers may comprise conductors, such as traces, ground planes, and vias. An IC substrate may include an electronic component mounted on a surface of the substrate. The electronic component may be functionally connected to other elements of an electronic system through a hierarchy of conductors that include the substrate traces, ground planes, and vias. The conductors may carry signals that are transmitted among the electronic components, such as IC's, of the system. An IC substrate may have a relatively large number of input/output ("I/O") terminals (also called "lands"), as well as a large number of power and ground terminals or lands, on a surface of the IC substrate.

In the field of electronics there is competitive pressure among manufacturers to drive the performance of their equipment up while driving down production costs and maintaining acceptable yield and reliability. This is particularly true regarding the packaging of dice on substrates, where each new generation of packaging must provide increased performance, particularly in terms of higher clock frequencies, while generally being smaller or more compact in size.

The I/O performance of an IC package that comprises two or more IC dice is affected by the length of interconnect lines used to couple the terminals on each die and the substrate. As the number of terminals that must be connected increases on each die, the lengths of the interconnects may need to be increased for proper routing. As the lengths of the interconnect lines are increased, there is greater likelihood that I/O performance will be degraded by interconnect parasitics, increased resistance, and the like.

For the reasons stated above, and for other reasons stated below that will become apparent to those skilled in the art upon reading and understanding this disclosure, there is a significant need in the art for apparatus and methods for packaging two or more dice on a substrate that optimize I/O performance and minimize production costs associated with multiple-die IC packages.

DETAILED DESCRIPTION

In the following detailed description of embodiments of the subject matter, reference is made to the accompanying drawings, which form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that structural, mechanical, compositional, electrical, and procedural changes may be made without departing from the spirit and scope of the subject matter. The following detailed description is, therefore, not to be taken in a limiting sense, and the scope of the subject matter is defined only by the appended claims.

The subject matter may provide a solution to certain problems that are associated with prior art packaging of integrated circuits. In an embodiment, two or more IC dice may be stacked and coupled using two or more different connection technologies. This may improve the I/O bandwidth of the resulting IC package, electronic assembly, or electronic system.

The term "connection technology" is defined herein to mean any of a plurality of structural and/or procedural ways to mechanically and electrically couple two or more packaging elements, whether or not such ways are presently known to those of ordinary skill in the relevant art.

Various embodiments are illustrated and described herein, including methods of fabrication, as well as application of the package to an electronic assembly and to an electronic system.

Figure 1:
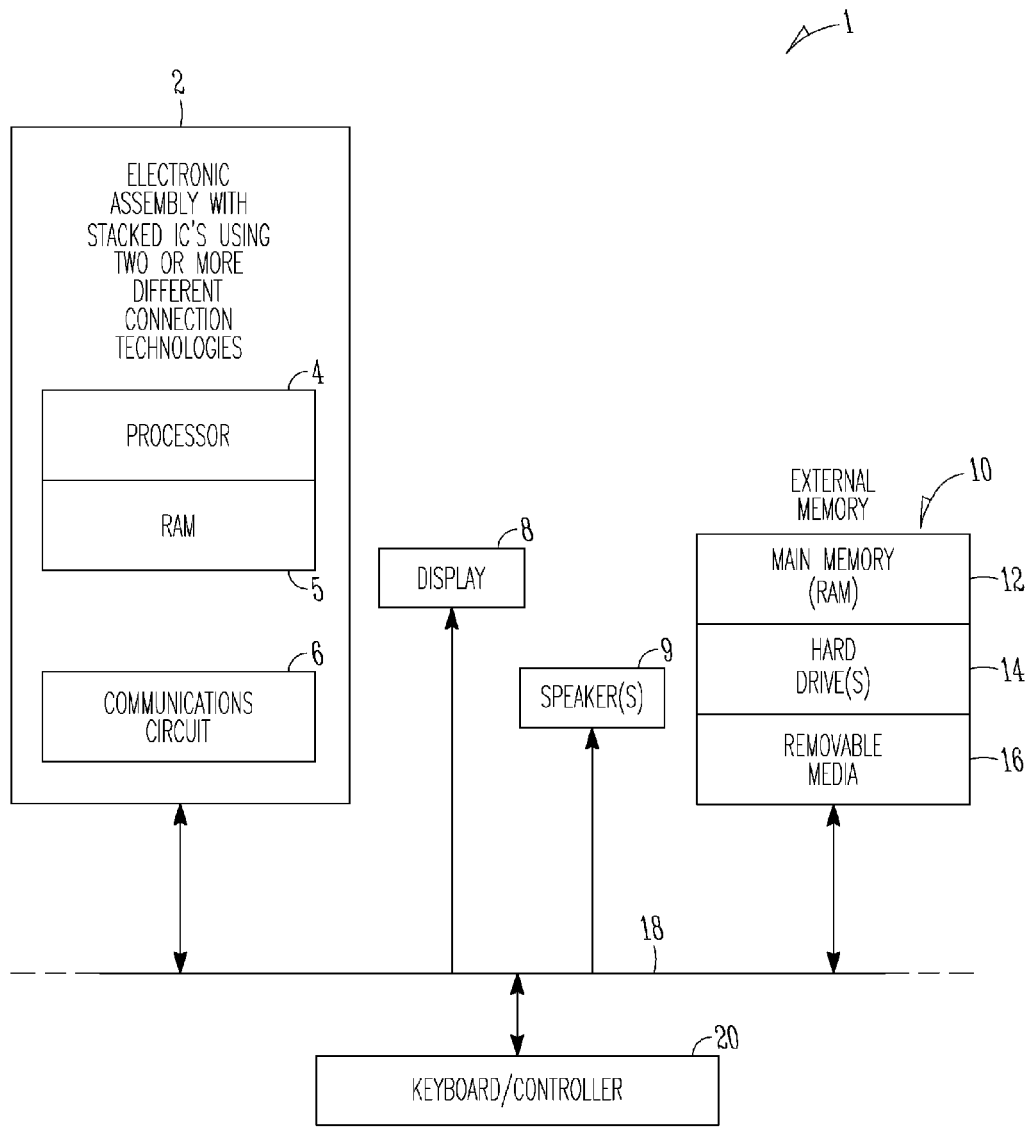
FIG. 1 is a block diagram of an electronic system incorporating at least one electronic assembly with an IC package containing stacked IC's using two or more different connection technologies, in accordance with an embodiment of the subject matter.

FIG. 1 is a block diagram of an electronic system 1 incorporating at least one electronic assembly 2 with an IC package containing stacked IC's using two or more different connection technologies, in accordance with an embodiment of the subject matter. Electronic system 1 is merely one example of an electronic system in which the subject matter may be used. In this example, electronic system 1 comprises a data processing system that includes a system bus 18 to couple various components of the system. System bus 18 provides communications links among various components of the electronic system 1 and may be implemented as a single bus, as a combination of busses, or in any other suitable manner.

"Suitable", as used herein, means having characteristics that are sufficient to produce the desired result(s). Suitability for the intended purpose can be determined by one of ordinary skill in the art using only routine experimentation.

Electronic assembly 2 is coupled to system bus 18. Electronic assembly 2 may include any circuit or combination of circuits, including IC's. In an embodiment, electronic assembly 2 includes at least one processor 4, which may be of any type, and at least one random access memory ("RAM") 5. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit. The one or more RAM's 5 may each be separate IC's. In an embodiment, the one or more RAM's 5 may each be a dynamic random access memory ("DRAM").

Other types of circuits that may be included in electronic assembly 2 are a custom circuit, an application-specific integrated circuit (ASIC), or the like, such as, for example, one or more circuits (such as a communications circuit 6) for use in wireless devices like cellular telephones, pagers, portable computers, personal digital assistants, two-way radios, and similar electronic systems. The circuits of electronic assembly 2, including IC's, may perform any other type of function.

Electronic system 1 may also include an external memory 10, which in turn may include one or more memory elements suitable to the particular application, such as a main memory 12 in the form of additional RAM beyond RAM 5, one or more hard drives 14, and/or one or more drives that handle removable media 16 such as floppy diskettes, compact disks (CDs), digital video disks (DVD), and the like.

Electronic system 1 may also include a display device 8, one or more speakers 9, and a keyboard and/or controller 20, which may include a mouse, trackball, game controller, voice-recognition device, or any other device that may permit a system user to input information into and receive information from the electronic system 1.

An electronic system 1 and/or data processing system that incorporates one or more electronic assemblies 2 that utilize an embodiment of the subject matter may improve high-speed I/O bandwidth associated with high performance IC's, and such systems may therefore be more commercially attractive than other systems.

Figure 2:
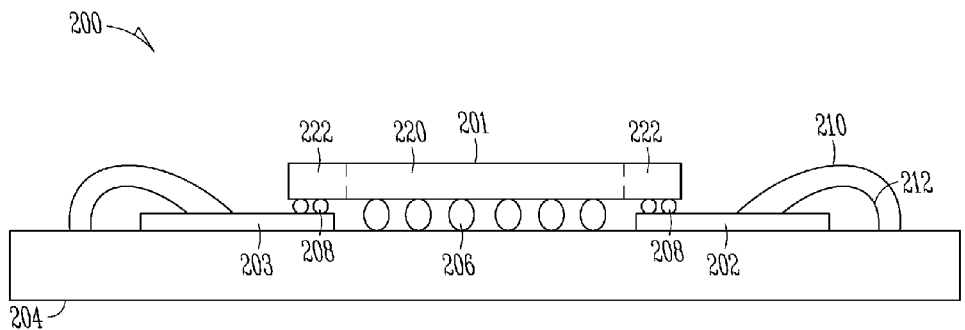
FIG. 2 illustrates a cross-sectional representation of an IC package comprising a plurality of stacked IC's using two or more different connection technologies, in accordance with an embodiment of the subject matter.

FIG. 2 illustrates a cross-sectional representation of an IC package 200 comprising a plurality of stacked IC's 201-203 using two or more different connection technologies, in accordance with an embodiment of the subject matter.

IC package 200 includes a first IC 201, which may be of a first type, such as a processor; a second IC 202, which may be of a first or second type, such as a DRAM; a third IC 203, which may be of a first, second, or third type; and an IC substrate 204.

Relatively large connectors 206, such as solder bumps or balls, may couple terminals or pads on the underside of IC 201 to corresponding terminals or lands on the upper surface of substrate 204. Relatively small connectors 208, such as solder bumps or balls, may couple terminals or pads on the underside of IC 201 to corresponding terminals or pads on the upper surfaces of IC 202 and/or IC 203. Thus, it will be seen that IC 201 is coupled to substrate 204 and to portions of IC's 202 and/or 203 using a C4 connection technology.

In an embodiment, connectors 206 may be located in a core portion 220 of IC 201, and connectors 208 may be located in a peripheral portion 222 of IC 201. In an embodiment, core portion 220 may comprise a plurality of power distribution vias, conductors, and terminals (not shown), and peripheral portion 222 of IC 201 may comprise a plurality of signal vias, conductors, and terminals (not shown). In other embodiments, the structure and content of core portion 220 and peripheral portion 222 may be different from that described immediately above.

In an embodiment, IC 202 may be electrically and mechanically coupled to substrate 204 by employing a different connection technology, such as wirebonding, using wire bonds 210 and 212. Wire bonds 210 and 212 may couple terminals or pads (e.g., pads 240 and 242, FIG. 3) on the upper surface of IC 202 to corresponding lands (e.g., lands 230 and 232, FIG. 3) on the upper surface of substrate 204. Wire bonds 210 and 212 may conduct power and/or I/O signals between IC 203 and substrate 204.

In an embodiment, IC 203 may also be electrically and mechanically coupled to substrate 204 with wirebonding or yet another suitable connection technology.

While the embodiment shown in FIG. 2 has been described with reference to three IC's, other embodiments of the subject matter may employ only two IC's or more than three IC's.

Figure 4:
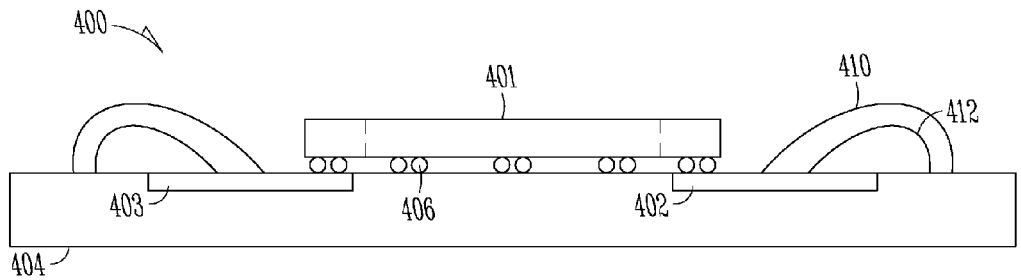
FIG. 4 illustrates a cross-sectional representation of an IC package comprising stacked IC's using two or more different connection technologies with a plurality of IC's embedded in the substrate, in accordance with an embodiment of the subject matter.

In an embodiment, IC's 202 and 203 may be partially embedded within substrate 204 instead of resting upon the upper surface of substrate 204. An embodiment having fully embedded IC's is shown in FIG. 4, which is described in detail further below.

Figure 3:
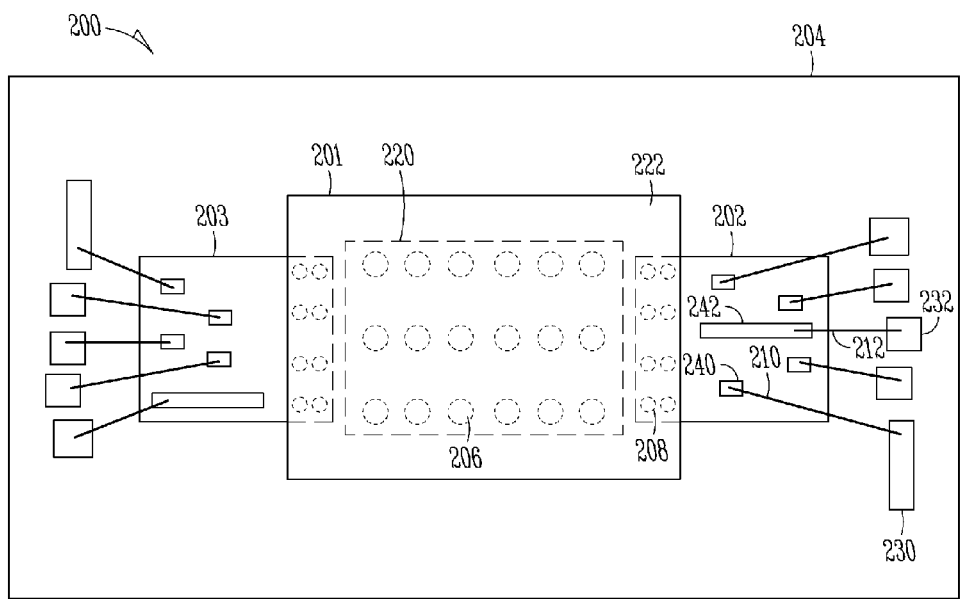
FIG. 3 illustrates a top view of an IC package comprising stacked IC's using a combination of controlled-collapse chip connection ("C4") and wirebonding, in accordance with an embodiment of the subject matter.

FIG. 3 illustrates a top view of an IC package 200 comprising stacked IC's 201-203 using a combination of controlled-collapse chip connection ("C4") and wirebonding, in accordance with an embodiment of the subject matter. IC package 200 may be similar or identical to IC package 200 shown in FIG. 2.

In FIG. 3, connectors 206 and 208 are shown in dashed outline, because they are beneath IC 201. The location and number of connectors 206 and 208 is for illustrative purposes only, and more or fewer connectors 206 and 208 may be employed.

Also seen in FIG. 3 are a plurality of terminals or pads on the upper surfaces of IC's 202 and 203, such as pad 240 and conductor 242. In addition, a plurality of lands 230 and 232 are seen on the upper surface of substrate 204. Wire bond 210 couples pad 240 to land 230, and wire bond 212 couples conductor 242 to land 232. The various pads, conductors, and lands may vary in size, shape, placement, and other aspects according to the requirements of the circuit layout.

Substrate 204 may be of any suitable type, and it may comprise ceramic and/or organic dielectric materials. In an embodiment, substrate 204 comprises organic dielectric materials.

Substrate 204 may comprise one or more dielectric layers (not shown) Substrate 204 may also comprise a number of conductors (not shown), such as traces, ground planes, and vias of any type. The conductors may be for signals, for power, and for ground. Various conductors may be formed in one or more layers within or between dielectric layers.

FIG. 4 illustrates a cross-sectional representation of an IC package 400 comprising stacked IC's 401-403 using two or more different connection technologies with a plurality of IC's 402-403 embedded in the substrate 404, in accordance with an embodiment of the subject matter.

A first IC 401, which may be of a first type, such as a processor, may be coupled to a substrate, such as IC substrate 404, using solder bumps or balls 406, which may be of a relatively uniform dimension, including height.

In an embodiment, a second IC 402 may be embedded within the upper surface of substrate 404.

In an embodiment, a third IC 403 may be embedded within the upper surface of substrate 404. Wire bonds 410 and 412 may electrically and mechanically couple pads (not shown) on the upper surfaces of the second IC 402 and the third IC 403 to corresponding lands (not shown) on the upper surface of the substrate 404.

IC's 402 and 403 may be embedded within substrate 404 by any suitable process, for example, cementing using an adhesive such as epoxy. Prior to or subsequent to being embedded within substrate 404, IC's 402 and 403 may be thinned by any suitable process such as lapping, etching, or the like.

Figure 5:
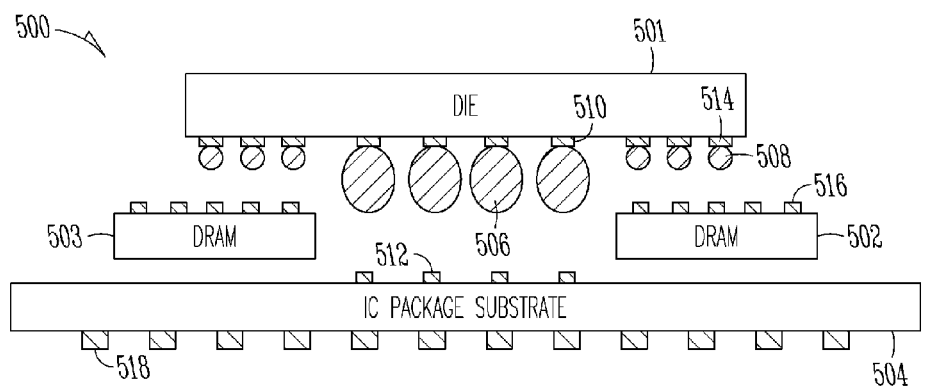
FIG. 5 illustrates a cross-sectional exploded representation of an IC package comprising stacked IC's using two or more different connection technologies with a plurality of dynamic random access memory ("DRAM") IC's placed between a processor IC and a substrate, in accordance with an embodiment of the subject matter.

FIG. 5 illustrates a cross-sectional exploded representation of an IC package 500 comprising stacked IC's 501-503 using two or more different connection technologies with a plurality of dynamic random access memory ("DRAM") IC's 502-503 placed between a processor IC 501 and a substrate 504, in accordance with an embodiment of the subject matter. IC package 500 may be similar or identical to IC package 200 shown in FIG. 2.

Terminals or pads 510 on the lower surface of IC 501 may be coupled to corresponding lands 512 on the upper surface of substrate 504 by relatively large connectors 506, such as solder bumps or balls. Relatively small connectors 508, such as solder bumps or balls, may couple terminals or pads 514 on the lower surface of IC 501 to corresponding lands 516 on the upper surfaces of a second IC 502, which may be of a first or second type of IC such as a DRAM, and of a third IC 503, which may be of a first, second, or third type of IC.

In an embodiment, connectors 506 may be located in a core portion of IC 501, and connectors 508 may be located in a peripheral portion of IC 501. In an embodiment, the core portion may comprise a plurality of power distribution vias, conductors, and terminals (not shown), and peripheral portion of IC 501 may comprise a plurality of signal vias, conductors, and terminals (not shown). In other embodiments, the structure and content of core portion and peripheral portion may be different from that described immediately above.

Terminals 518 on the lower surface of substrate 504 may be used to couple electronic assembly 500 to a printed circuit board ("PCB"), a motherboard, a mezzanine board, or to another packaging element of an electronic system.

Figure 6:
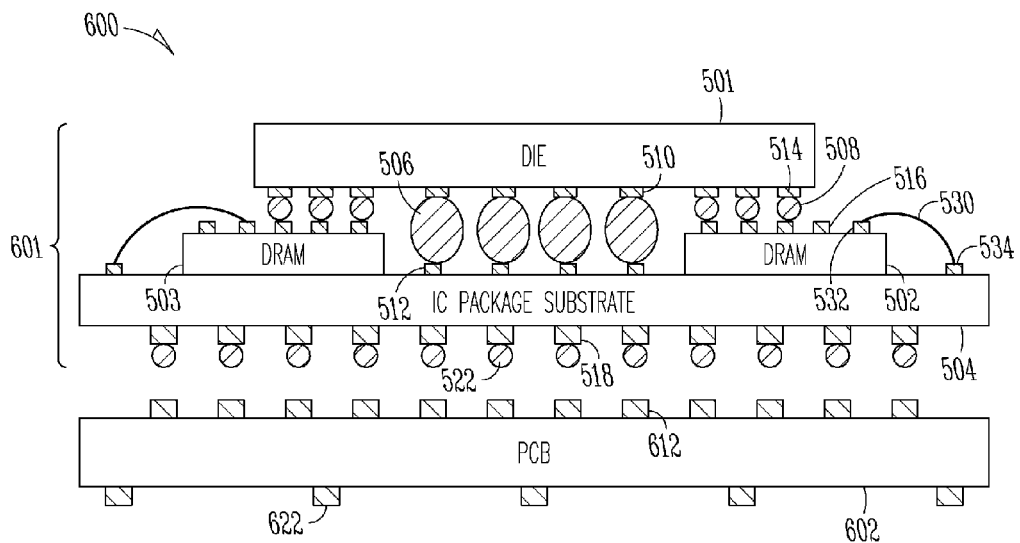
FIG. 6 illustrates a cross-sectional representation of an electronic assembly comprising an IC package with stacked IC's using two or more different connection technologies, in accordance with an embodiment of the subject matter.

FIG. 6 illustrates a cross-sectional representation of an electronic assembly 600 comprising an IC package 601 with stacked IC's 501-503 using two or more different connection technologies, in accordance with an embodiment of the subject matter. IC package 601 may be similar or identical to IC package 500 shown in FIG. 5.

It will be seen that IC 501 is coupled to substrate 504 and to portions of IC's 502 and 503 using a C4 connection technology.

In an embodiment, a second IC 502 may be electrically and mechanically coupled to substrate 504 with a different connection technology, such as wirebonding, by employing one or more wire bonds. As an example, wire bond 530 may couple a terminal or pad 532 on the upper surface of IC 502 to a corresponding land 534 on the upper surface of substrate 504. The one or more wire bonds, such as wire bond 530, may conduct power and/or signals between IC 502 and substrate 504.

In an embodiment, a third IC 203 may also be electrically and mechanically coupled to substrate 504 with wirebonding or yet another suitable connection technology.

While the embodiment shown in FIG. 6 has been described with reference to three IC's, other embodiments of the subject matter may employ only two IC's or more than three IC's.

In an embodiment, IC's 502 and 503 may be partially or fully embedded within substrate 504 instead of resting upon the upper surface of substrate 504.

IC package 601 may be coupled to an additional substrate 602, such as a PCB, a motherboard, a mezzanine board, or the like. Additional substrate 602 may be a one-layer board or a multi-layer board. Substrate 504 of IC package 601 may be coupled to additional substrate 602 through pads 518 on the lower surface of substrate 504, solder balls or bumps 522, and corresponding lands 612 on the upper surface of additional substrate 602. Additional substrate 602 may include one or more additional terminals 622 for mating with an additional packaging structure (not shown).

The fabrication of an IC package having stacked IC dice using two or more different connection technologies will now be described.

Figure 7:
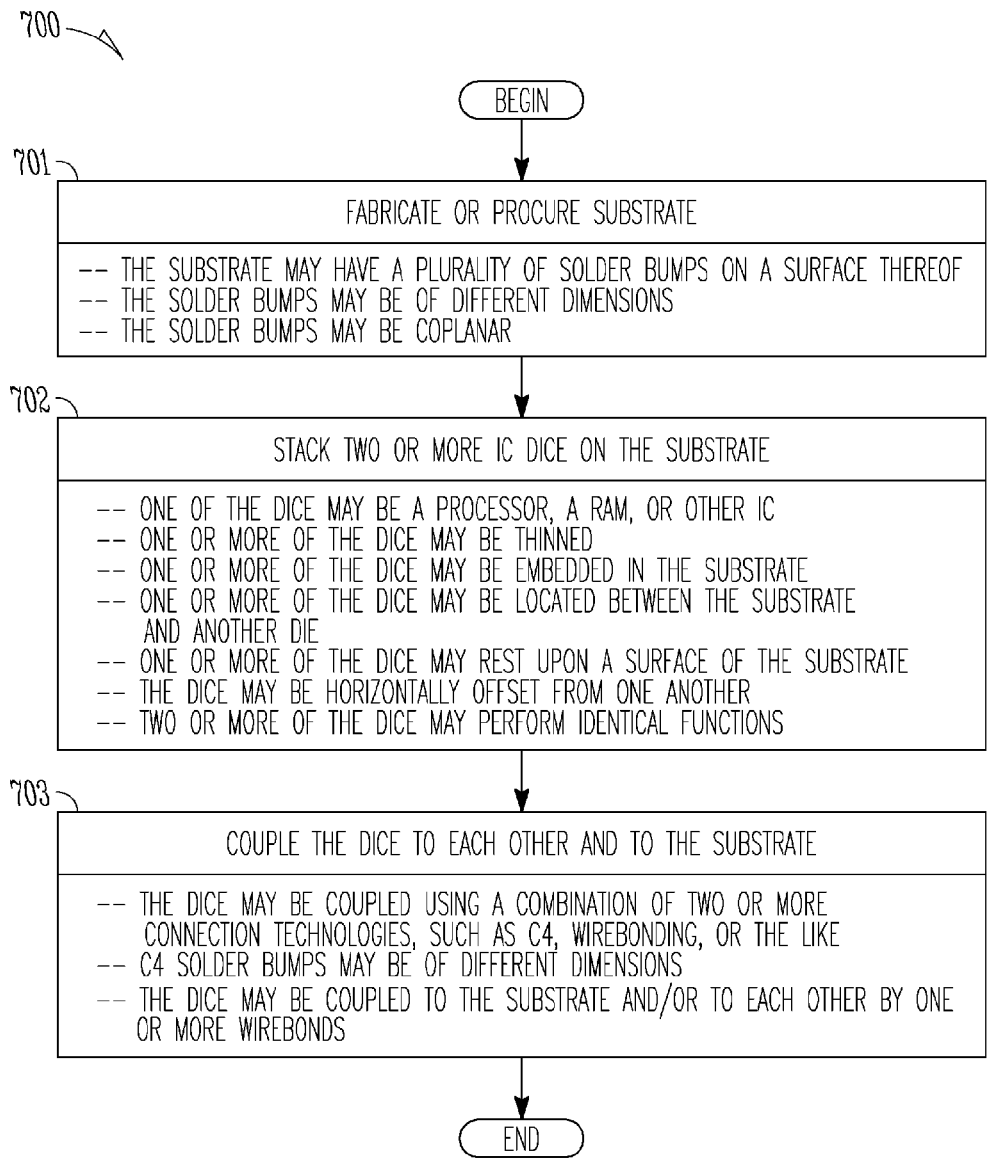
FIG. 7 is a flow diagram of several alternative methods of fabricating an IC package with stacked IC's using two or more different connection technologies, in accordance with various embodiments of the subject matter.

FIG. 7 is a flow diagram of several alternative methods of fabricating an IC package with stacked IC's using two or more different connection technologies, in accordance with various embodiments of the subject matter.

In 701, a substrate is fabricated or procured. The substrate may be an IC package substrate. Alternatively, it could be a PCB, motherboard, mezzanine board, or other type of substrate. In an embodiment, the substrate may comprise a large number of signal, power, and ground nodes, including a plurality of terminals or lands on an upper surface thereof, and a plurality of terminals or pads on a lower surface thereof. The substrate may have a plurality of solder balls or bumps coupled to the terminals of one or more surfaces thereof. Alternatively, solder bumps may be preattached to the pads of one or more IC's to be coupled to the substrate. The solder bumps may be of different dimensions. For example, they may have different heights, as seen in FIGS. 2 and 5, for example. A plurality of solder bumps may be coplanar, in that at least one point of each of the plurality of solder bump lies in a common plane.

In 702, two or more IC dice are stacked on the substrate. The IC dice may be capable of performing any type of function or functions. In an embodiment, a die may comprise a processor, a random access memory ("RAM"), and/or other combinations of active components. That is, a single IC die may comprise any combination of functional components.

For example, a single die may comprise more than one processor and/or more than one RAM.

One or more of the dice may be thinned. For example, with reference to FIG. 4, IC 402 and/or IC 403 may be thinned prior to or subsequent to being embedded within substrate 404.

One or more of the dice may be embedded in the substrate. For example, with reference to FIG. 4, IC 402 and/or IC 403 may be embedded within substrate 404.

One or more of the dice may be located between the substrate and another die. For example, with reference to FIG. 2, IC's 202 and 203 may be located between the substrate 204 and IC 201.

One or more of the dice may rest upon a surface of the substrate. For example, with reference to FIG. 6, the lower surface of IC 502 may rest upon the upper surface of substrate 504. Similarly, the lower surface of IC 503 may rest upon the upper surface of substrate 504.

The dice may be stacked in such a manner that they are horizontally offset from one another. That is, they may be stacked in a staggered fashion, wherein they are not necessarily vertically aligned. For example, with reference to FIG. 2, IC's 202 and 203 are horizontally offset from IC 201.

Additionally, two or more of the dice may be similar or identical. For example, two or more dice may perform similar or identical functions. As another example, two or more dice may have similar or identical physical dimensions. With reference to FIG. 5, IC's 502 and 503 may both be DRAM's in an embodiment.

The dice may have a plurality of mounting contacts, which may also be referred to herein as "terminals" or "pads". The terminals or pads may have coupled thereto any suitable connection elements, such as solder bumps or balls, wires, or other connectors. With reference to FIG. 5, IC 501 may comprise a plurality of pads 510 and 514. Pads 510 may have solder balls 506 coupled thereto, and pads 514 may have solder balls 508 coupled thereto. IC 502 may comprise a plurality of pads 532 (FIG. 6) to which one or more wires 530 may be attached at any suitable point in the fabrication process.

In 703, the dice are coupled to each other and to the substrate. The IC dice may be coupled using a combination of two or more different connection technologies, such as controlled-collapse chip connection ("C4") solder bumps, wirebonding, or the like.

If a C4 connection technology is used, the C4 bumps may be of different dimensions. In an embodiment, the C4 bumps may vary in height so as to be coplanar across their top surfaces, while their bottom surfaces may be coupled to the substrate and to the upper surfaces of one or more IC dice that may be at different heights.

Still with reference to 703 of FIG. 7, the dice may be coupled to the substrate and/or to each other by one or more wirebonds, utilizing a wirebond connection technology. In an embodiment, wirebonds may be used in addition to C4 bumps to couple lands on the substrate supplying signal, power, ground, or the like to corresponding pads on one or more of the IC dice. For example, with reference to FIG. 6, a combination of C4 and wirebond connection technologies is used in an embodiment, as described above.

The operations described above with respect to the methods illustrated in FIG. 7 may be performed in a different order from those described herein. Although the flow diagram of FIG. 7 shows an "End", it may be performed continuously if desired.

The above-described choice of materials; geometry; number, order, dimensions, and composition of packaging structures; fabrication operations; and assembly sequencing may all be varied by one of ordinary skill in the art to optimize the performance characteristics of the package.

The resulting package is flexible in terms of the orientation, size, number, order, and composition of its constituent elements. Various embodiments of the subject matter may be implemented using various combinations of substrate and component technologies, choice of materials, and fabrication operations, to achieve the advantages of the inventive subject matter. The structure, including types of materials used, dimensions, layout, geometry, and so forth, of the package may be built in a wide variety of embodiments, depending upon the operational requirements.

FIGS. 1-6 are merely representational and are not drawn to scale. Certain proportions thereof may be exaggerated, while others may be minimized. FIGS. 1-7 are intended to illustrate various embodiments of the subject matter that can be understood and appropriately carried out by those of ordinary skill in the art.

The inventive subject matter provides for an electronic package, an electronic assembly, an electronic system, and methods of manufacture thereof that may improve high-speed I/O bandwidth associated with high performance IC's. Other embodiments will be readily apparent to those of ordinary skill in the art after reading this disclosure.

While certain operations have been described herein relative to "upper" and "lower" surfaces, it will be understood that these descriptors are relative, and that they would be reversed if the package or assembly were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An integrated circuit package comprising:
   a substrate having a plurality of lands;
   a first die having a first plurality of terminals coupled to selected ones of the plurality of lands, the first die further having a second plurality of terminals; and
   a second die, between the first die and the substrate, having a third plurality of terminals, selected ones of which are coupled to the second plurality of terminals;

wherein the first die is coupled to the substrate by a first plurality of controlled-collapse chip connection (C4) solder bumps.

2. The package recited in claim 1, wherein the first die comprises a processor or a dynamic random access memory.

3. The package recited in claim 1, wherein the first die and the second die are horizontally offset from one another.

4. The package recited in claim 1, wherein one or more of the dice is thinned.

5. The package recited in claim 1, wherein the second die is embedded in the substrate.

6. The package recited in claim 1, wherein the first die is coupled to the second die by a second plurality of controlled-collapse chip connection (C4) solder bumps, and wherein the first and second pluralities of C4 solder bumps are of different dimensions.

7. The package recited in claim 6, wherein ones of the third plurality of terminals are coupled to ones of the plurality of lands using wire bonds.

8. The package recited in claim 1, wherein the first die has a fourth plurality of terminals, the package further comprising:
a third die, between the first die and the substrate, having a fifth plurality of terminals, selected ones of which are coupled to the fourth plurality of terminals.

9. The package recited in claim 8, wherein the second die and the third die are identical.

10. An electronic assembly comprising:
a first die having a first plurality of contacts on a surface thereof,
a second die having a second plurality of contacts on a surface thereof that are coupled to selected ones of the first plurality of contacts;
a plurality of controlled-collapse chip connection (C4) solder bumps coupling the selected ones of the first plurality of contacts with the second plurality of contacts;
a first substrate to which the first and second dies are coupled and having a plurality of pads; and
a second substrate having a plurality of lands on a surface thereof, the lands being coupled to corresponding pads of the first substrate.

11. The electronic assembly recited in claim 10, wherein at least one die comprises a processor and at least one die comprises a dynamic random access memory.

12. The electronic assembly recited in claim 10, wherein one or more of the dice is thinned.

13. The electronic assembly recited in claim 10, wherein one or more of the dice is embedded in the substrate.

14. The electronic assembly recited in claim 10, wherein the C4 solder bumps are of different heights.

15. The electronic assembly recited in claim 10, wherein one or more of the dice is electrically coupled to the substrate by a plurality of wirebonds.

* * * * *